(12) United States Patent
Fujimori

(10) Patent No.: US 6,870,228 B2
(45) Date of Patent: Mar. 22, 2005

(54) SYSTEM AND METHOD TO REDUCE NOISE IN A SUBSTRATE

(75) Inventor: Ichiro Fujimori, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 237 days.

(21) Appl. No.: 10/294,880

(22) Filed: Nov. 14, 2002

(65) Prior Publication Data

US 2004/0026722 A1 Feb. 12, 2004

Related U.S. Application Data

(60) Provisional application No. 60/402,095, filed on Aug. 7, 2002.

(51) Int. Cl.[7] .............................................. H01L 23/62
(52) U.S. Cl. ...................................... 257/357; 257/355
(58) Field of Search ................................ 257/357, 355, 257/356, 365, 274, 350, 351

(56) References Cited

U.S. PATENT DOCUMENTS 5,581,103 A * 12/1996 Mizukami ................... 257/355
6,180,998 B1 * 1/2001 Crafts ......................... 257/659
6,403,992 B1 * 6/2002 Wei ............................. 257/204

* cited by examiner

Primary Examiner—Phat X. Cao
(74) Attorney, Agent, or Firm—McAndrews, Held & Malloy, Ltd.

(57) ABSTRACT

A system and method for reducing noise in a substrate of a chip is provided. The system may include a substrate (70) doped with a first dopant. A first well (80) may be disposed on the substrate and doped with a second dopant. A second well (120) may be disposed within the first well (80) and doped with the second kind of dopant. A first transistor (100) may include one or more first transistor components disposed in the second well (120). The first transistor (100) may be adapted to employ a first type of channel having a quiet voltage source (140) connected to a body thereof. A third well (110) may be disposed within the first well (80) and doped with the first kind of dopant. A second transistor (90) may include one or more second transistor components that may be disposed in the third well (110). The second transistor (90) may be adapted to employ a second type of channel. The first well (80) may shield the substrate (70) from noise in the second well (120) and third well (110).

11 Claims, 3 Drawing Sheets

SYSTEM AND METHOD TO REDUCE NOISE IN A SUBSTRATE

CROSS-REFERENCE TO RELATED APPLICATION/INCORPORATION BY REFERENCE

This application makes reference to, claims priority to and claims the benefit of U.S. Provisional Patent Application Ser. No. 60/402,095 (filed on Aug. 7, 2002.

This application also makes reference to U.S. Pat. No. 6,424,194, U.S. application Ser. No. 09/540,243 filed on Mar. 31, 2000, U.S. Pat. Nos. 6,389,092, 6,340,899, U.S. application Ser. No. 09/919,636 filed on Jul. 31, 2001, U.S. application Ser. No. 09/860,284 filed on May 18, 2001, U.S. application Ser. No. 10/028,806 filed on Oct. 25, 2001, U.S. application Ser. No. 09/969,837 filed on Oct. 1, 2001, U.S. application Ser. No. 10/159,788 entitled "Phase Adjustment in High Speed CDR Using Current DAC" filed on May 30, 2002, U.S. application Ser. No. 10/179,735 entitled "Universal Single-Ended Parallel Bus; fka, Using 1.8V Power Supply in 0.13 MM CMOS" filed on Jun. 21, 2002, and U.S. application Ser. No. 60/402,097 entitled "System and Method for Implementing a Single Chip Having a Multiple Sub-layer PHY" filed on Aug. 7, 2002.

All of the above stated applications are incorporated herein by reference in their entirety.

BACKGROUND OF THE INVENTION

As more and more functional blocks are added, for example, to a chip, an integrated circuit (IC) or an integrated system or device, the risk for the generation and propagation of noise between the different functional blocks or within a functional block may become quite substantial.

An exemplary conventional complementary metal oxide semiconductor (CMOS) transistor arrangement is illustrated in FIG. 1. As shown in FIG. 1, the conventional CMOS transistor arrangement 10 includes an n-channel MOS (NMOS) transistor 30 and a p-channel MOS (PMOS) transistor 40. The conventional CMOS arrangement 10 also includes a p-substrate 20 (e.g., a p−-substrate). The NMOS transistor 30 is disposed in the p-substrate 20. The NMOS transistor 30 includes a p+-body (B), an n+-source (S) and an n+-drain (D) disposed in the p-substrate 20. A voltage source $V_{SS}$ 7 having a ground is coupled to the p+-body (B) and the n+-source (S) of NMOS transistor 30. An input line 5 is coupled to a gate (G) of the NMOS transistor 30. An output line 15 is coupled to the n+-drain (D) of the NMOS transistor 30. The PMOS transistor 40 includes an n-well 50 that is disposed in the p-substrate 20. The PMOS transistor 40 also includes an n+-body (B), a p+-source (S) and a p+-drain (D) disposed in the n-well 50. A voltage source $V_{DD}$ 17 is coupled to the p+-source (S) and the n+-body (B) of PMOS transistor 50. The input line 5 is also coupled to a gate of the PMOS transistor 40. The output line 15 is also coupled to the p+-drain (D) of the PMOS transistor 40.

During normal operation of the conventional CMOS transistor arrangement 10, the voltage sources $V_{SS}$ 7, $V_{DD}$ 17 may be noisy. For example, the noise may be caused by other circuitry found on or coupled to the chip that may directly or indirectly affect the voltage sources $V_{SS}$ 7, $V_{DD}$17. High swing or high power devices such as, data drivers in a wire line communication system or transmitters in wireless communications systems, may be sources of noise. The noise may also be caused, for example, by the driving of active circuits. In one example, the voltage sources may be coupled to active circuitry (e.g., active portions of an inverter circuit) which may cause transient currents to flow during signal transitions from a high level to a low level or from a low level to a high level. In another example, noise may be caused by transitions in a signal propagated or generated by the chip.

In the NMOS transistor 30, if the voltage source $V_{SS}$ 7 is noisy, then the noise may propagate to the p-substrate 20 via, for example, at least through the resistive coupling 9 between the p+-body (B) and the p-substrate 20. In the PMOS transistor 40, if the voltage source $V_{DD}$ 17 is noisy, then the noise may propagate to the n-well 50 via the n+-body (B) of the PMOS transistor 40 via a resistive coupling 19. The noise in the n-well 50 may propagate to the p-substrate 20 via, for example, at least the capacitive coupling 29 between the n-well 50 and the p-substrate 20. If the noise is able to propagate to the p-substrate 20, then noise may propagate to or otherwise affect other circuits on or off the chip that may be coupled to the p-substrate 20.

FIG. 1A shows another conventional CMOS arrangement 10, which is similar to the conventional CMOS arrangement 10 shown in FIG. 1, except that a quieter voltage source $V_{SS}$ 3 is coupled to the p+-body (B) of the NMOS transistor 30 and a noisy voltage source $V_{SS}$ 7 is coupled to the n+-source (S) of the NMOS transistor 30. Thus, less noise is resistively coupled from the p+-body (B) to the p-substrate 20. To a lesser extent, noise may be capacitively coupled between the n+-source and the p-substrate 20. Noise may be coupled from the PMOS transistor 40 to the p-substrate 20 as described above with respect to the conventional CMOS arrangement 10 as shown in FIG. 1. In the CMOS arrangement of FIG. 1A, noise may substantially propagate to the p-substrate 20. Accordingly, there is a need to mitigate noise in the substrate of a chip.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Aspects of the present invention may be found in, for example, systems and methods that reduce noise in a substrate. In one embodiment, the present invention provides a system that may reduce noise in the substrate of a chip, integrated circuit or other similar device. The system may include, a substrate doped with a first dopant. A first well doped with a second dopant may be disposed on the substrate. The first well may be a deep well. Additionally, a second well may be disposed within the first well and doped with the second dopant. A first transistor having a first transistor type which may include one or more first transistor components, may be disposed in the second well. A quiet voltage source may be connected to a body of the first transistor. A third well may be further disposed within the first well and doped with the first kind of dopant. A second transistor may include one or more second transistor components that may be disposed in the third well. The second transistor may be adapted to employ a second type of channel. In this arrangement, the first well may isolate noise between the second well and the substrate, thereby reducing the amount of noise transferred to the substrate.

The first and second transistor may be coupled in a CMOS transistor arrangement, although the invention in not limited in this regard. Notwithstanding, the first transistor may be a p-channel MOS (PMOS) transistor and the second transistor may be a n-channel MOS (NMOS) transistor. The PMOS transistor may include a source coupled to a noisy voltage source. Both the noisy and the quiet voltage source may be configured in such a manner that they produce approximately the same output voltage. Since the noise in the second well emanates mainly from the body of the PMOS transistor, the body of the PMOS transistor may be coupled to the second well in order to reduce noise in the substrate. The noise may include digital noise although the invention is not limited in this regard. The NMOS transistor may include a body and a source that may be coupled to a noisy voltage source. Furthermore, the body of the NMOS transistor may be capacitively coupled to the substrate.

In another aspect of the invention, a method for reducing noise in the substrate of a chip is provided. The method may include the step of doping a substrate with a first dopant and doping a first well disposed on the substrate with a second dopant. The first well may be a deep well. A second well disposed within the first well may be doped with a second dopant. A first transistor having a first transistor channel type and one or more transistor components may be disposed within the second well. A quiet voltage source may be coupled to a body of the first transistor. A third well disposed within the first well may be doped with the first dopant. A second transistor having a second transistor type and one or more transistor components may be disposed within the third well. In this arrangement, disposing the first well between the substrate and the second well may reduce noise in the substrate.

The first and second transistor may be configured in a CMOS arrangement. In this regard, the first transistor may be configured as a PMOS transistor and the second transistor may be configured as a NMOS transistor. A noisy voltage source may be coupled to the source of the PMOS transistor. Approximately the same voltage level may be supplied to the PMOS transistor by both voltage sources. To reduce noise in the substrate, the body of the PMOS transistor may be resistively coupled to the second well. The body and source of the NMOS transistor may both be coupled to a noisy voltage source. The body of the NMOS transistor may be coupled to the substrate.

In accordance with one aspect of the invention, a method for reducing noise in a chip is also provided. The method may include the step of shielding a substrate layer of the chip from a transistor layer of the chip using a shielding layer. A p-type transistor located within the transistor layer, may be capacitively coupled to the shielding layer. A quiet voltage source may be coupled to a body of the p-type transistor. An n-type transistor may be resistively coupled within the transistor layer to the shielding layer. Notably, the shielding layer may be capacitively coupled to the substrate layer to reduce noise transferred to the substrate layer.

The shielding step may further include the step of disposing the shielding layer between the substrate layer and the transistor layer of the chip. In this regard, the disposing step may include disposing a deep N-well as a shielding layer between the substrate and the transistor layer. A noisy voltage source may be coupled to a source of the n-type transistor. A noisy voltage source may be coupled to both a source and a body of the p-type transistor.

These and other advantages, aspects and novel features of the present invention, as well as details of an illustrated embodiment thereof, will be more fully understood from the following description and drawings.

DETAILED DESCRIPTION OF THE INVENTION

Figure 1:
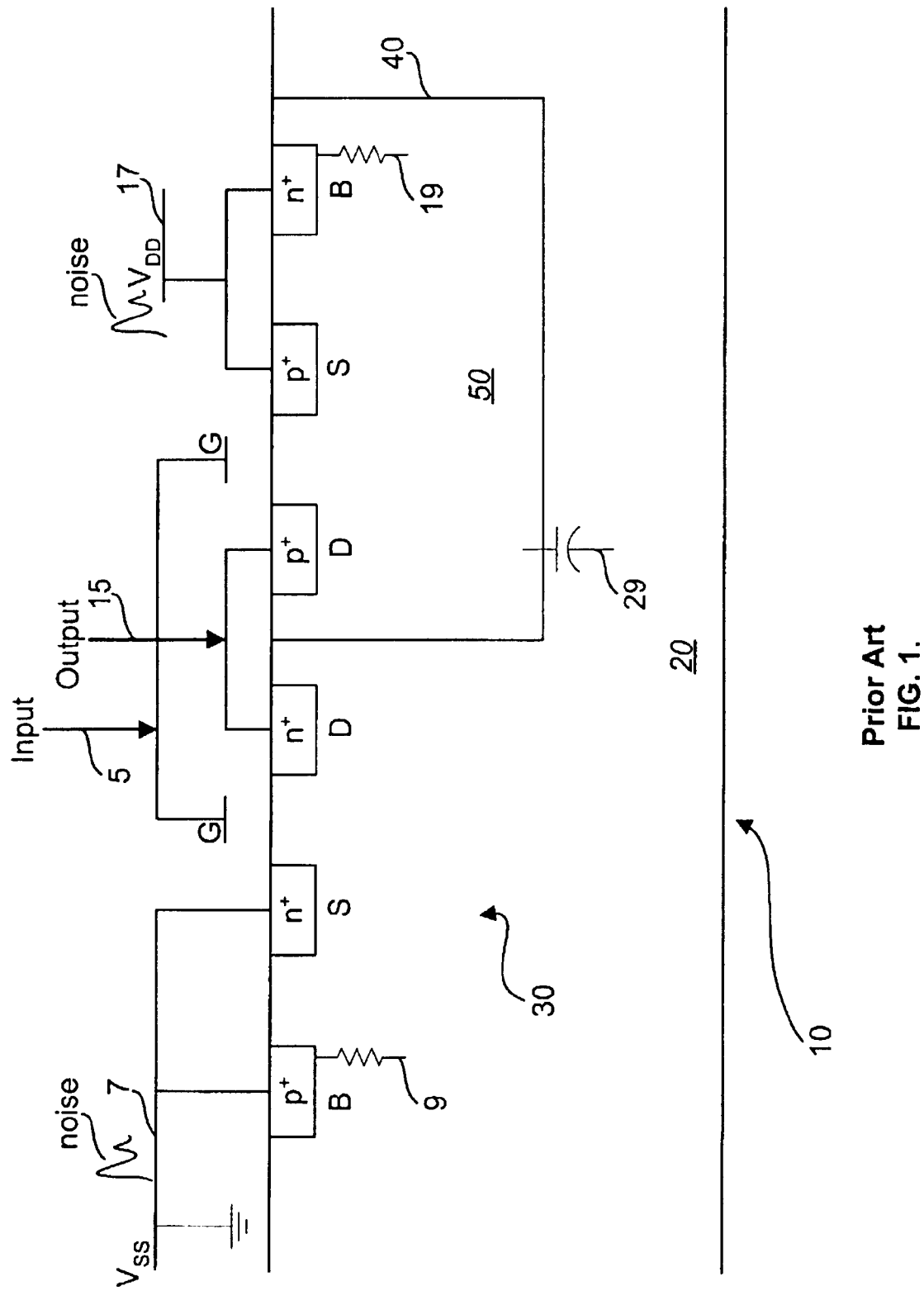
FIGS. 1 and 1A shows embodiments of conventional complementary metal oxide semiconductor (CMOS) transistor arrangements.
Figure 1A:
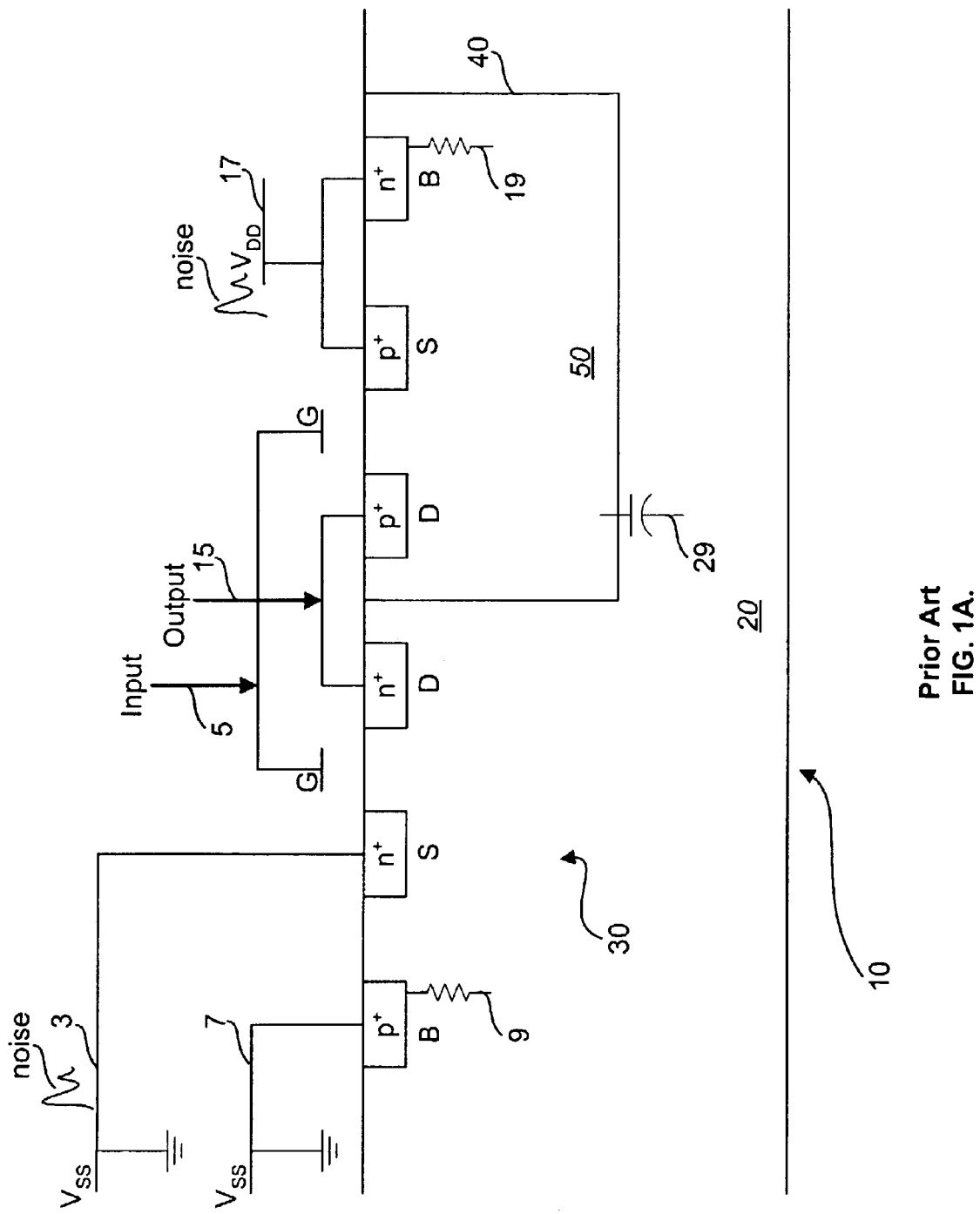
Figure 2:
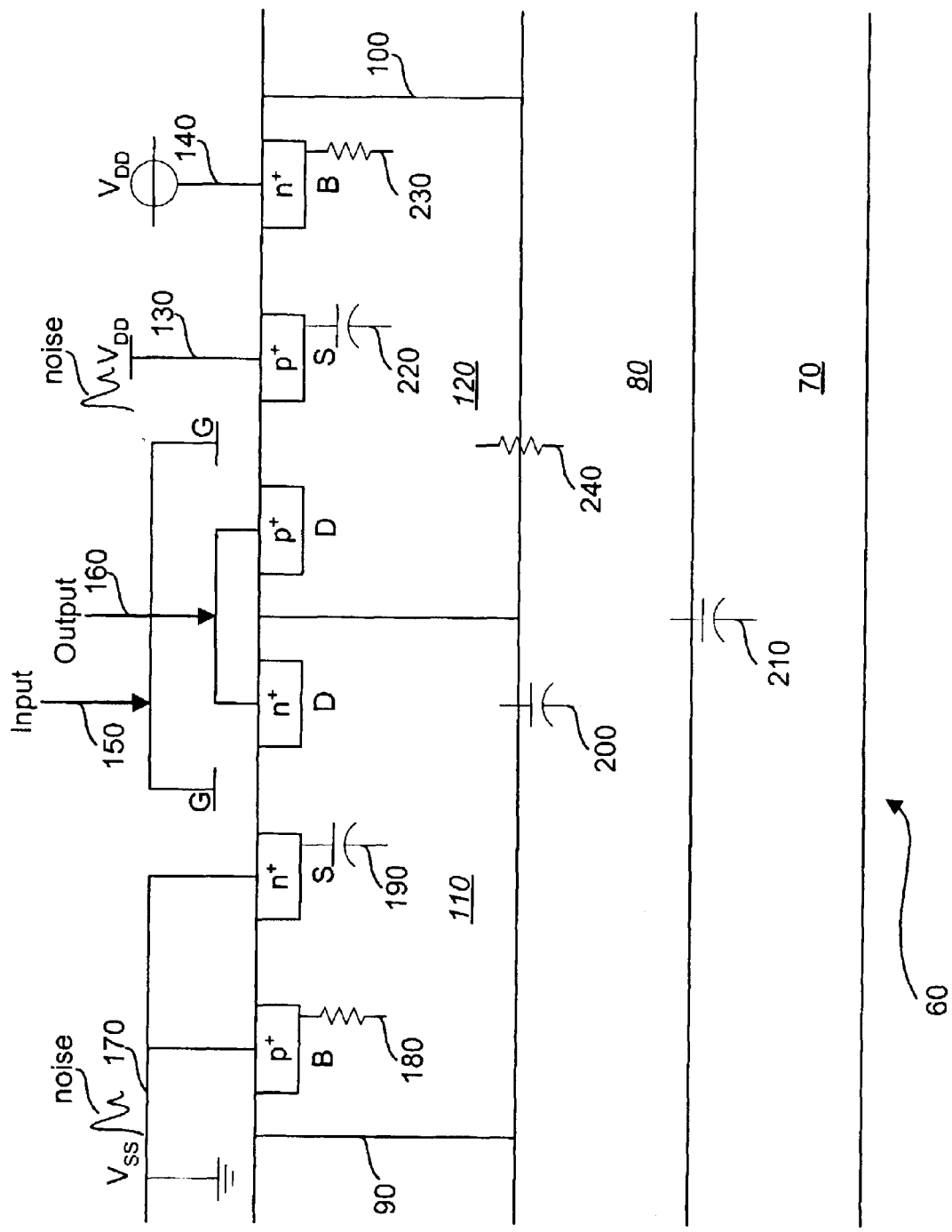
FIG. 2 shows an embodiment of a CMOS transistor arrangement according to the present invention.

FIG. 2 shows an embodiment of a complementary metal oxide semiconductor (CMOS) transistor arrangement 60 in accordance with the present invention. The CMOS transistor arrangement 60 may include a p-substrate 70, a deep n-well 80, an n-channel MOS (NMOS) transistor 90 and a p-channel MOS (PMOS) transistor 100. The NMOS transistor 90 may include, for example, a $p^+$-body (B), an $n^+$-source (S) and an $n^+$-drain (D) which may be disposed in a p-well 110. The p-well 110 may be an isolated p-well since, for example, it may be disposed between two n-wells 120 and the deep n-well 80. A voltage source $V_{SS}$ 170 having an electrical ground, may be coupled to the $p^+$-body (B) and the $n^+$-source (S) of the NMOS transistor 90. An input signal line 150 may be coupled to a gate of the NMOS transistor 90. An output signal line 160 may be coupled to the $n^+$-drain of the NMOS transistor 90.

The PMOS transistor 100 may include, for example, an $n^+$-body (B), a $p^+$-source (S) and a $p^+$-drain (D), which may be disposed in an n-well 120. A first voltage source $V_{DD}$ 130 may be coupled to the $p^+$-source (S) and a second voltage source $V_{DD}$ 140 may be coupled to the $n^+$-body (B) of the PMOS transistor 100. In one embodiment, the second voltage source $V_{DD}$ 140 is less noisy than the first voltage source $V_{DD}$ 130. In this regard, $V_{DD}$ 140 may be a quieter voltage source in comparison to the voltage source $V_{DD}$ 130. The input signal line 150 may be coupled to a gate of the PMOS transistor 100. The output signal line 160 may be coupled to the $p^+$-drain (D) of the PMOS transistor 100.

The voltage source $V_{DD}$ 130 and the quieter voltage source $V_{DD}$ 140 may be different voltage sources. The quieter voltage source $V_{DD}$ 140 may be a dedicated voltage source that is not coupled to some sources of noise. For example, it can be an active component of a transistor. The quieter voltage source $V_{DD}$ 140 may be dedicated, for example, to a guard bar for well taps or substrate taps. Alternatively, the voltage source $V_{DD}$ 130 and the quieter voltage source $V_{DD}$ 140 may be coupled to the same voltage source. However, the quieter voltage source $V_{DD}$ 140 may be isolated or separated from the voltage source $V_{DD}$ 130 so that less noise may be carried by the quieter voltage source $V_{DD}$ 140.

In operation, the voltage source $V_{SS}$ 170 and the voltage source $V_{DD}$ 130 may be noisy due to a number of factors, some of which are described herein. For example, the noise may be caused by other circuitry found on or coupled to the chip that may directly or indirectly affect the voltage sources $V_{SS}$ 170, $V_{DD}$ 130. High swing or high power devices such as, data drivers in a wire line communication system or transmitters in wireless communications systems, may be sources of noise. The noise may also be caused, for example, by the driving of active circuits. In one example, the voltage sources may be coupled to active circuitry (e.g., active portions of an inverter circuit) which may cause transient currents to flow during signal transitions from a high level to a low level or from a low level to a high level. In another example, noise may be caused by transitions in a signal propagated or generated by the chip and/or any associated circuitry.

In accordance with the inventive CMOS transistor arrangement 60, one source of noise is that the voltage sources $V_{SS}$ 170, $V_{DD}$ 130 may be coupled to the sources of the NMOS transistor 90 and the PMOS transistor 100. Thus, for example, when the circuit is in a transitional state such as during a signal transition from a high level to a low level or from a low level to a high level, a transient current may flow between the voltage sources $V_{SS}$ 170 and $V_{DD}$ 130. Notably, if other devices (e.g., other CMOS transistor arrangements) are sharing the voltage sources $V_{SS}$ 170, $V_{DD}$ 130, then the noise generated by the transient current flows may be substantial.

The noise in the voltage source $V_{SS}$ 170 may flow into the body (B) and the source (S) of the NMOS transistor 90. The body (B) of the NMOS transistor 90 may be resistively coupled 180 to the p-well 110 and the source (S) of the NMOS transistor 90 may be capacitively coupled 190 to the p-well 110. The resistive coupling 180 may be much more substantial than the capacitive coupling 190. Accordingly, most of the noise in the p-well 110 may be associated with the $p^+$-body of the NMOS transistor 90. For the noise in the p-well 110 to reach the p-substrate 70, the noise may need to pass through two capacitive couplings: a capacitive coupling 200 between the p-well 110 and the deep n-well 80 and a capacitive coupling 210 between the deep n-well 80 and the p-substrate 70. Importantly, the capacitive coupling is generally fairly weak, but the capacitive coupling is even weaker when the couplings are placed in series. Thus, in this embodiment of the present invention, the resistive couplings 180, 200 and 210 between the $p^+$-body (B) of the NMOS transistor 90 through to the p-substrate 70 may be replaced with a much weaker capacitive coupling.

The noise in the voltage source $V_{DD}$ 130 may flow into the $p^+$-source (S) of the PMOS transistor 100. In this embodiment, the present invention may employ a quieter voltage source $V_{DD}$ 140 which may be coupled to the $n^+$-body (B) of the PMOS transistor 100. The $p^+$-source (S) of the PMOS transistor 100 may be capacitively coupled 220 to the n-well 120 and the $n^+$-body (B) of the PMOS transistor 100 may be resistively coupled 230 to the n-well 120. Since the resistive coupling 230 may be more substantial than the capacitive coupling, the noise in the n-well 120 may be mostly from the quieter voltage source $V_{DD}$ 140. Advantageously, the noise in the n-well 120 may be substantially reduced by connecting the quieter voltage source $V_{DD}$ 140 to the $n^+$-body (B) of the PMOS transistor 100. The n-well 120 and the deep n-well 80 may be resistively coupled 240. Notably, the deep n-well 80 may provide a substantial amount of resistance to the noise, thereby further reducing any noise propagating through PMOS resistor 100 and reaching substrate 70. The deep n-well 80 and the p-substrate 70 may be capacitively coupled, which may offer the noise only a weak coupling.

Although illustrated in use with a CMOS transistor arrangement, the present invention need not be so limited. The present invention may also be applicable for use with other types of transistors or other types of transistor arrangements. Notably, in a an embodiment of the invention, the quiet $V_{dd}$ may be used to replace a conventional $V_{ss}$ without an area penalty. In this regard, the area used by the $V_{dd}$ may replace the area used by the $V_{ss}$, in for example, a block or standard resistor/transistor logic (RTL) arrangement. The present invention may also be applicable for use with other electrical, magnetic or electromagnetic components or circuits. Furthermore, although one or more of the embodiments described above may employ semiconductor materials (e.g., semiconductor material, compound semiconductor material, etc.), the present invention may also contemplate using other materials (e.g., ceramics, metals, alloys, superconductors, etc.) or combinations thereof. In addition, the present invention may also contemplate using different dopant types, dopant schemes or dopant concentrations other than or in addition to the above-described dopant types, dopant schemes or dopant concentrations.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system for reducing noise in the substrate of a chip, the system comprising:

a substrate doped with a first dopant;

a first well disposed on top of the substrate and doped with a second dopant;

a second well disposed within the first well, the second well doped with the second dopant;

a first transistor comprising at least one first transistor component disposed in the second well, the first transistor adapted to employ a first type of channel having a quiet voltage source connected to a body thereof;

a third well disposed within the first well, the third well doped with the first dopant; and a second transistor comprising at least one second transistor component disposed in the third well, the second transistor adapted to employ a second type of channel, the first well isolating noise between the second well and the substrate.

2. The system according to claim 1, wherein the first transistor and the second transistor are coupled in a complementary metal oxide semiconductor (CMOS) transistor arrangement.

3. The system according to claim 1, wherein the first transistor is a p-channel MOS (PMOS) transistor and the second transistor is an n-channel MOS (NMOS) transistor.

4. The system according to claim 3, wherein the PMOS transistor comprises a source coupled to a noisy voltage.

5. The system according to claim 4, wherein the noisy voltage source and the quiet voltage source provide approximately a same voltage level.

6. The system according to claim 4, wherein the body of the PMOS transistor is resistively coupled to the second well, and wherein the noise in the second well emanates primarily from the body of the PMOS transistor.

7. The system according to claim 3, wherein the NMOS transistor comprises a body and a source both coupled to a noisy voltage source.

8. The system according to claim 7, wherein the body of the NMOS transistor is capacitively coupled to the substrate.

9. The system according to claim 3, wherein the first well comprises a deep well.

10. The system according to claim 3, wherein the first well is adapted to shield the substrate from noise emanating from a voltage source coupled to at least one of the first transistor and the second transistor.

11. The system according to claim 10, wherein the noise comprises digital noise.

* * * * *